United States Patent [19]
Volk et al.

[11] Patent Number: 5,999,020
[45] Date of Patent: Dec. 7, 1999

[54] HIGH-SPEED, DIFFERENTIAL PAIR INPUT BUFFER

[75] Inventors: Andrew M. Volk, Loomis; Sandeep K. Jain, Rancho Cordova, both of Calif.

[73] Assignee: Intel Corporation, Santa Clara, Calif.

[21] Appl. No.: 08/977,798

[22] Filed: Nov. 25, 1997

[51] Int. Cl.$^6$ .................................................... H03K 5/22
[52] U.S. Cl. ................................ 327/67; 327/87; 327/89
[58] Field of Search .............................. 327/65, 67, 77, 327/87, 88, 89, 56, 227, 229, 230, 544, 563; 326/17, 83, 86, 115, 121; 330/252, 253

[56] References Cited

U.S. PATENT DOCUMENTS

| | | | |
|---|---|---|---|
| 3,991,380 | 11/1976 | Pryor | 330/13 |
| 4,769,564 | 9/1988 | Garde | 307/530 |
| 5,278,467 | 1/1994 | Nedwek | 307/530 |
| 5,596,291 | 1/1997 | Runas | 327/108 |
| 5,847,581 | 12/1998 | Allen | 326/81 |

OTHER PUBLICATIONS

U.S. Patent Application Serial No. 08/775,785, filed Dec. 31, 1996, entitled "Low Power CMOS Precision Input Receiver with Integrated Reference," by Michael J. Allen (invention disclosure dated Feb. 8, 1996).

*Primary Examiner*—Kenneth B. Wells
*Assistant Examiner*—Hai L. Nguyen
*Attorney, Agent, or Firm*—Blakely, Sokoloff, Taylor & Zafman LLP

[57] ABSTRACT

A high-speed, differential pair input buffer is constructed from a conventional differential pair having a data input terminal, a reference voltage input terminal, and an output terminal. A voltage source Vsupply and its ground connection are coupled to the differential pair through a first pair of transistors. The first pair of transistors have their enable inputs coupled to the data input terminal so that they are both biased "on" during a transition in a logic signal delivered to the data input terminal. The output terminal of the differential pair is connected through a delay circuit to the enable input terminals of a second pair of transistors, which also interconnect the differential pair to the voltage source $V_{supply}$ and system ground. Thus, the second pair of transistors provide a feedback path to enable the differential pair to conduct current longer if a load connected to the output of the differential pair slows the transition of the output of the differential pair.

13 Claims, 4 Drawing Sheets

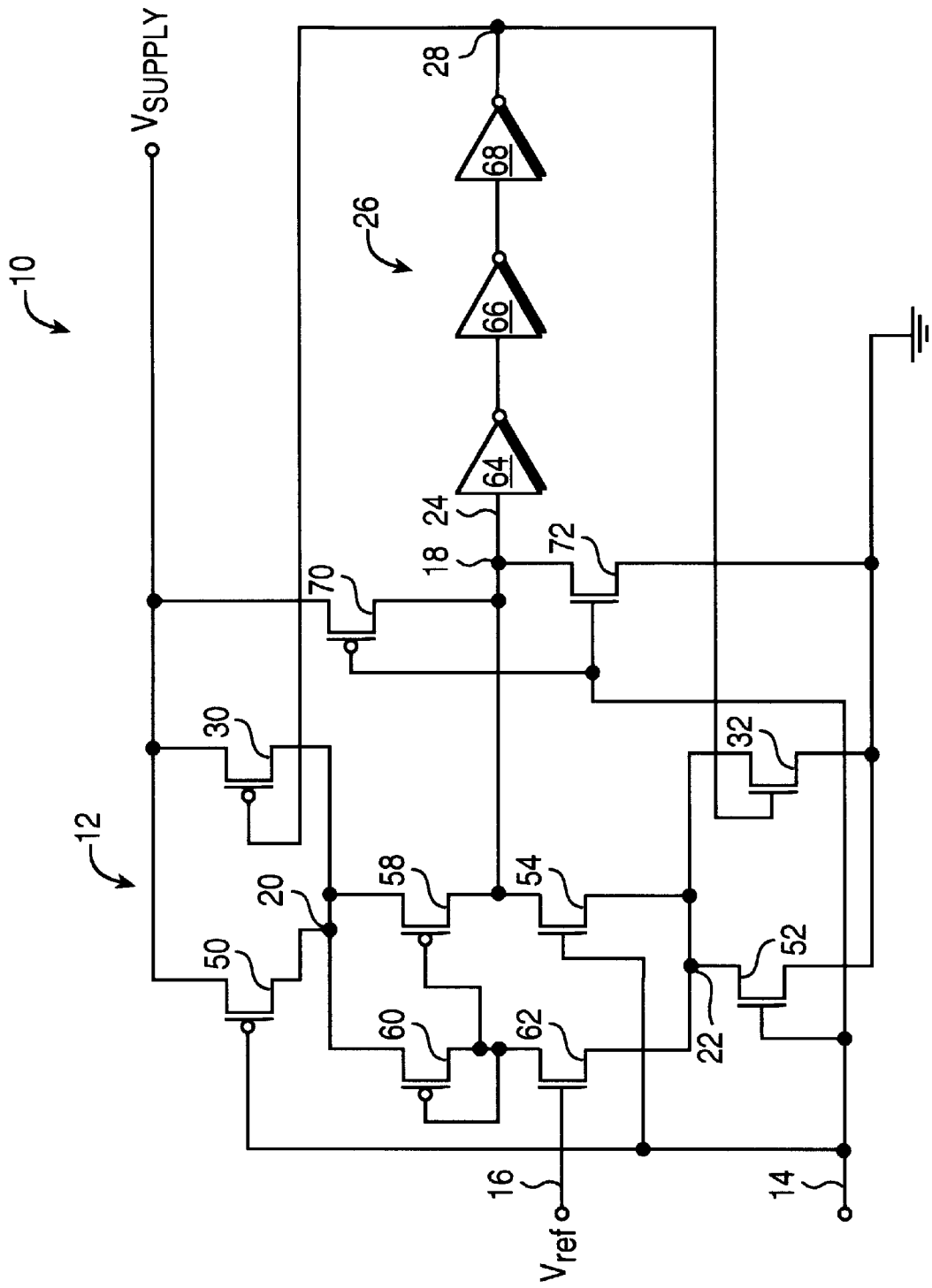

HIGH-SPEED, DIFFERENTIAL PAIR INPUT BUFFER

BACKGROUND OF THE INVENTION

1. Field of the Invention

This invention relates generally to input buffer circuitry, and, more particularly, to an input buffer implemented with a high-speed, differential pair.

2. Description of Related Art

Buffer circuitry is commonly used to interface electrical circuits. There are at least three significant considerations in the design of a buffer circuit: speed, timing, and power. The speed consideration of a buffer circuit refers to how fast the buffer circuit transitions from one logical state to another (e.g., high-to-low or low-to-high). A buffer circuit that has a transition time slower than the circuits that it interfaces will slow the overall operation of the device. That is, while the interfaced circuits may be designed for optimum operation at a preselected speed, a slow interface circuit may prevent the interfaced circuits from achieving their desired optimal speed.

The timing consideration of the buffer circuit is closely related to the speed consideration, but refers to variations in the transition time of the buffer circuit. That is, many interfaced circuits have critical timing requirements that will not tolerate variations in transition times. Prior art buffer circuits are known to be sensitive to variations in their loads. Different loads will result in different transition times for the same buffer circuit. Thus, designers have typically designed buffer circuits with load as a design parameter. In other words, designers have been forced to design a different buffer circuit for every different loads. In a typical electrical component, such as a microprocessor, thousands of different buffer circuits may be needed, requiring numerous buffer designs. This duplicative design effort is plainly inefficient and expensive.

The power consideration of the buffer circuit refers to the amount of power consumed to operate the buffer circuit. High power consumption is a significant disadvantage in all electrical circuits where heat dissipation is a consideration, as power consumed is directly related to heat produced. Additionally, high power consumption is particularly problematic in battery operated devices, such as portable computers, as increased power consumption directly leads to reduced battery life.

These three design considerations are often at odds with one another. For example, designers have attempted to improve the timing characteristics of buffer circuits by employing a differential pair. The use of a differential pair improves timing by insuring that the transition from one state to another occurs at a precisely controlled voltage level. However, there is a direct tradeoff between the speed of a conventional differential pair verses the amount of biasing current flowing through the differential pair. Thus, increasing the speed of the conventional differential pair will increase the biasing current or power consumed by the conventional differential pair.

The present invention is directed to overcoming, or at least reducing the effects of, one or more of the problems set forth above.

SUMMARY OF THE INVENTION

In one aspect of the present invention, a buffer is provided. The buffer includes a differential pair having a data input terminal, a reference voltage input terminal, an output terminal, and at least one power supply terminal. A first transistor is adapted for coupling the power supply terminal to a voltage source. The first transistor has an enable input terminal coupled to the data input terminal. A second transistor is coupled in parallel with the first transistor and has an enable input terminal coupled to the output terminal of the differential pair.

In another aspect of the present invention, a method is provided for controlling a differential pair input buffer. The method includes coupling the differential pair to a power supply through a first path during a transition between logic levels in a data input signal delivered to the differential pair; and coupling the differential pair to the power supply through a second path for a period of time after the transition in the data input signal delivered to the differential pair.

BRIEF DESCRIPTION OF THE DRAWINGS

Other objects and advantages of the invention will become apparent upon reading the following detailed description and upon reference to the drawings in which:

FIG. 2 is a schematic diagram of an embodiment of the instant invention; and

Figure 1A:
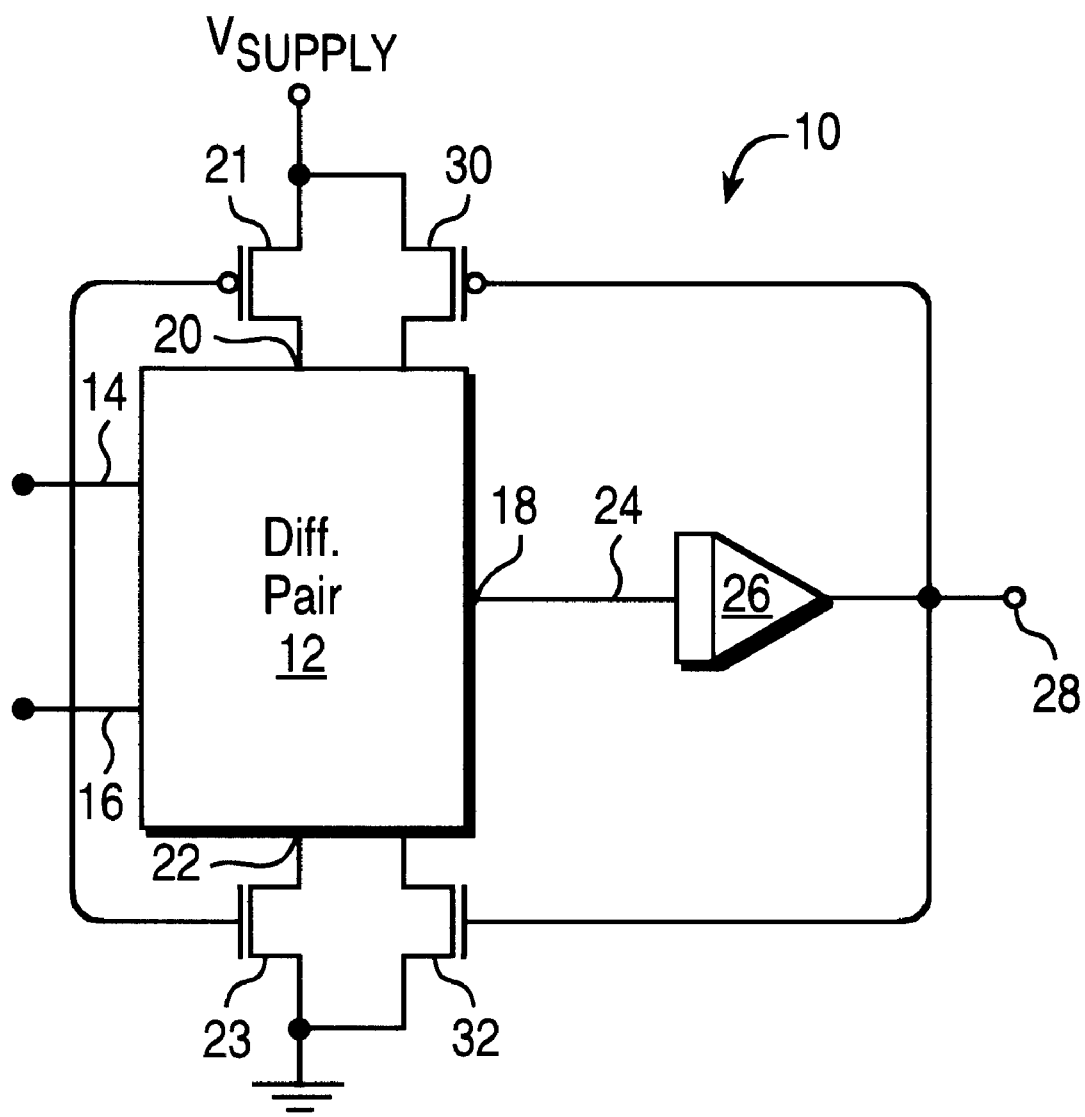
FIGS. 1A and 1B are a stylized diagrams of embodiments of the instant invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1A, a stylized drawing of an embodiment of the instant invention is shown. A high-speed, differential pair input buffer 10 is shown to be constructed from a conventional differential pair 12 having a data input terminal 14, a reference voltage input terminal 16, and an output terminal 18. A voltage source $V_{supply}$ is connected to one power terminal 20 of the differential pair 12 through a transistor 21, and system ground is connected to a second power terminal 22 of the differential pair 12 through a transistor 23. The transistors 21, 23 have their enable inputs coupled to the data input terminal 14 so that they are both biased "on" during a transition in a logic signal delivered to the data input terminal 14.

The output terminal 18 is connected through a line 24 to a delay circuit 26. The delay circuit 26 has its output connected to an output terminal 28 of the high-speed, differential pair input buffer 10. The output of the delay circuit 26 is also coupled to the enable input terminals of a pair of transistors 30, 32, which respectively operate to controllably interconnect the differential pair 12 to the voltage source $V_{supply}$ and system ground. Thus, the transistors 30, 32 respond to the output of the high-speed, differential pair input buffer 10 to provide feedback indicative of a load (not shown) connected to the output terminal 28. As is discussed in greater detail below, the feedback path allows the high-speed, differential pair input buffer 10 to adapt its operation to a variety of loads connected to its output terminal 10 so that switching time and quiescent current are not adversely impacted.

During normal operation, current flows through the differential pair 12 from the voltage source $V_{supply}$ to ground through the transistors 21, 23 during a transition time in a signal delivered through the data input terminal 14, ultimately resulting in a signal on the output terminal 18 also transitioning from one logical level to another (i.e., high-to-low, low-to-high). A similar transition in a signal at the output terminal 28 will follow the transition occurring at the output terminal 18, but its transition time is impacted by the magnitude of the load connected to the output terminal 28. For example, if the output terminal 28 is attempting to transition from a logically low level to a logically high level, its transition time is slowed by a greater load connected to the output terminal 28. This slowed transition time is fed back to the transistors 30, 32, biasing one of the pair "on" and permitting additional current to flow through the differential pair 12 during the slowed transition. The additional current flowing through the differential pair 12 during a slowed transition at the output terminal 28 helps to boost the transition time of the signal at the output terminal 28. Thus, the high-speed, differential pair input buffer 10 can be used to drive a wider variety of loads without the necessity of re-design, and without wasted consumption of power, or reduced switching times.

Figure 1B:
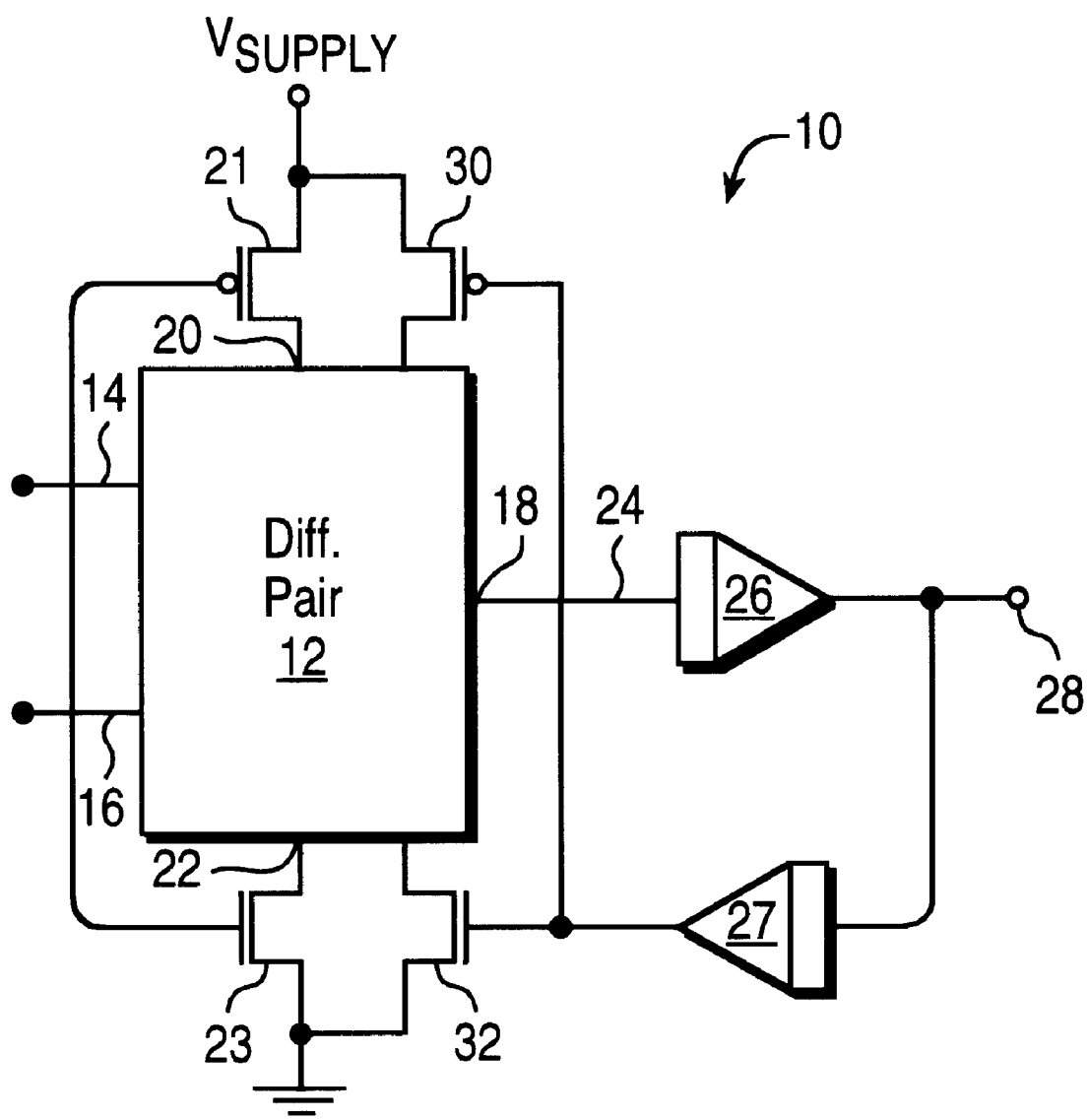

FIG. 1B shows an alternative embodiment of the instant invention. The alternative embodiment of FIG. 1B differs from that shown in FIG. 1A by the addition of a delay element 27 positioned in the feedback path to the transistors 30, 32. By locating the delay element 27 in the feedback path, the delay element 26 may be reduced to provide less delay. A reduced delay from the delay element 26 advantageously reduces propagation time, but placing the delay element 27 in the feedback loop ensures that the differential pair is biased "on" longer to account for varying loads.

Turning now to FIG. 2, an electrical schematic of an embodiment of a high-speed differential pair input buffer 10 is illustrated. The data input terminal 14 is coupled to the gates of PMOS transistor 50 and NMOS transistors 52, 54. The PMOS transistor 50 is coupled between the voltage supply $V_{supply}$ and differential current paths 56 comprised of PMOS transistors 58, 60 and NMOS transistors 62, 54. The gate of the NMOS transistor 62 is coupled to the reference voltage input terminal 16. The gates of the PMOS transistors 58, 60 are coupled together and to the junction of the transistors 60, 62, thereby configuring the PMOS transistor 60 as a diode.

The delay circuit 26 is comprised of a series of three inverters 64, 66, 68 in this embodiment. The number of inverters 64-68 may be varied to provide a suitable delay for the intended use of the differential pair input buffer 10. The output of the delay circuit 26 is fed back to the gates of the transistors 30, 32, which are connected in parallel with the transistors 50, 52, respectively. In the illustrated embodiment, the feedback transistors 30, 32 are a PMOS and NMOS transistor, respectively.

Finally, a pair of weak keeper transistors 70, 72 are coupled between the output terminal 18 of the differential pair 12 and the voltage source $V_{supply}$ and system ground, respectively. In the illustrated embodiment, the keeper transistors 70, 72 are PMOS and NMOS transistors, respectively, with their gates coupled together and to the data input terminal 14.

Figure 3:
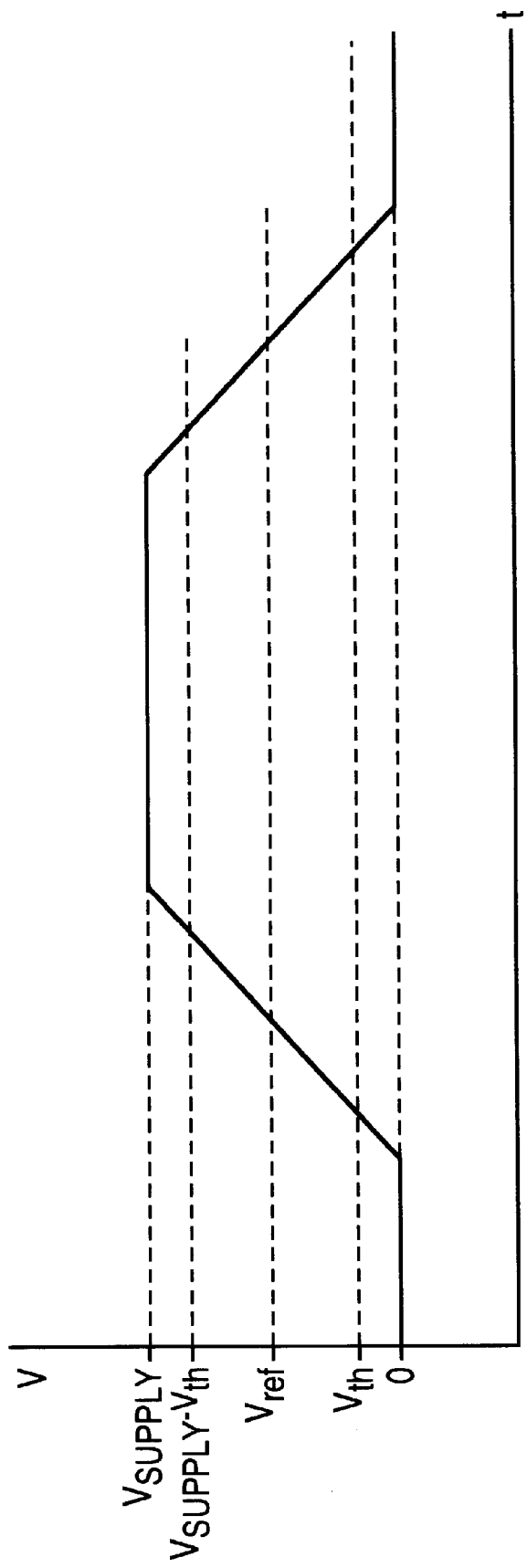
FIG. 3 is a stylized waveform of a data input signal to the instant invention.

The operation of the embodiment of the high-speed, differential pair input buffer 10 shown in FIG. 2 is described herein in conjunction with the waveform of FIG. 3. Assuming that the data input signal applied to the data input terminal 14 is at a logically low level of about system ground, then the transistor 52 is biased "off," and no current flows through the differential current paths 56. At this time the PMOS transistor 70 is biased "on," pulling the output terminal 18 toward the voltage supply $V_{supply}$. The transistor 70 is, however, relatively small, allowing only a small amount of current to flow therethrough. The small current flowing through the transistor 70 helps keep the output terminal 18 at a logically high level, but is insufficient to pull the output terminal from a logically low level to a logically high level. Rather, the differential current paths 56 operate to transition the output terminal 18 between logic levels.

As illustrated in FIG. 3, the data input signal begins to transition from system ground toward $V_{supply}$. Once the voltage level of the data input signal reaches the threshold voltage level $V_{th}$ of the NMOS transistor 52, current begins to flow from the voltage supply $V_{supply}$ through the PMOS transistor 50, the differential current paths 56, and the NMOS transistor 52 to system ground. The amount of current flowing is relatively constant, but is divided between the parallel paths through the transistors 60, 62 and 58, 54. The amount of current flowing through each of the parallel paths depends on the relative voltage levels applied to the gates of the transistors 54, 62. That is, at the time that current first begins to flow, the voltage level applied to the gate of the NMOS transistor 54 is at about $V_{th}$, which is substantially less than the reference voltage $V_{ref}$. Thus, substantially more current flows through the transistor 62 than through the transistor 54. With little current flowing through the transistor 54, the output terminal 18 remains in its logically high state, and the output terminal 28 of the delay circuit 26 remains forced to a logically low state. The logically low state at the output terminal 28 is fed back to the gates of the transistors 30, 32, biasing the PMOS transistor 30 "on." Since the transistor 50 is connected in parallel with the transistor 30 and is also biased "on," the transistor 30 has no appreciable effect on the operation of the buffer 10 at this time.

As the data input voltage on the terminal 14 continues to rise, it will attain a value substantially equivalent to the reference voltage $V_{ref}$ such that substantially equal amounts of current will flow through the transistors 54, 62, pulling the output terminal 18 toward ground. Thereafter, as the data input voltage level rises above the reference voltage $V_{ref}$ more current will flow through the transistor 54 than through the transistor 62, pulling the output terminal 18 toward system ground more quickly. This process continues until the voltage input signal rises above a voltage level greater than $V_{supply}-V_{th}$, biasing the transistor 50 "off," and halting the flow of current therethrough.

However, the output terminal 28 will not yet have transitioned to a logically high level, owing to the delaying action of the serially connected inverters 64, 66, 68 and the effect of a load (not shown) connected to the output terminal 28. Rather, the output terminal 28 remains at a logically low level for a period of time after the data input signal transitions to a logically high level. The period of time that the output terminal 28 remains logically low is a factor of the delay circuit 26 and the load (not shown) connected to the output terminal 28. That is, the greater the load, the longer the output terminal 28 will remain logically low. The logically low level at the output terminal 28 is fed back to the PMOS transistor 30, biasing it "on," and allowing current to continue to flow through the differential paths 56 despite the transistor 50 being biased "off." This continued flow of current through the transistors 58, 54 pulls the output terminal 18 toward ground, speeding the switching of the output terminal 18 from a logically high state to a logically low state. Once the output terminal 28 transitions to a logically high state, the transistor 30 is also biased "off," and current flow through the differential paths 56 ceases.

A similar operation of the transistors 32, 52 occurs in response to a high-to-low transition of the data input signal. Referring again to FIGS. 2 and 3, as the voltage level of the data input signal falls below $V_{supply}-V_{th}$, the transistor 50 is again biased "on," allowing current to flow through the differential paths 56. As the voltage level of the data input signal falls below $V_{ref}$, more current flows through the transistors 60, 62 than through the transistors 58, 54, pulling the output terminal 18 toward $V_{supply}$. This process continues until the voltage level of the data input signal falls below $V_{th}$, biasing the transistor 52 "off." However, owing once again to the delay circuit 26 and the load connected to the output terminal 28, the voltage level at the output terminal 28 remains at a logically high state, biasing the transistor 32 "on" and allowing current to continue to flow through the differential paths 56. The continued current flowing through the differential paths 56 allows the buffer 10 to continue to pull the output terminal 18 toward a logically high state, thereby enhancing the transition time over conventional differential pair buffer circuits.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A buffer, comprising:
   a differential pair having a data input terminal, an output terminal, and at least one power supply terminal;
   a first transistor adapted for coupling said power supply terminal to a voltage supply, said first transistor having an enable input terminal coupled to said data input terminal; and
   a second transistor coupled in parallel with said first transistor and having an enable input terminal coupled to receive a delayed output signal from the output terminal of said differential pair through a delay circuit coupled between said output terminal and said enable input terminal.

2. The buffer of claim 1, wherein said delay circuit includes at least one inverter.

3. The buffer of claim 2, wherein said first and second transistors are PMOS transistors.

4. The buffer of claim 1, wherein said differential pair further comprises:
   a third transistor adapted for coupling a second power supply terminal of said differential pair to a supply return, said third transistor having an enable input terminal coupled to said data input terminal; and
   a fourth transistor coupled in parallel with said third transistor and having an enable input terminal coupled to receive the delayed output signal from the output terminal of said differential pair.

5. The buffer of claim 4, including a delay circuit coupled between the differential pair output terminal and the enable input terminals of the second and fourth transistors to provide the delayed output.

6. A buffer, comprising:
   a differential pair having a data input terminal, an output terminal, and at least one power supply terminal;
   first means for controllably coupling the power supply terminal of said differential pair to a voltage supply in response to a transition in a signal received on said data input terminal; and
   second means for controllably coupling the power supply terminal of said differential pair to the voltage supply for a period of time after the first means has transitioned to decouple the voltage supply, said second means having its transition delayed by a delayed feedback from the output terminal of the differential pair through a delay circuit coupled between said output terminal and said second means.

7. The buffer of claim 6, wherein said differential pair is adapted to respond to a transition between logic levels on said data input terminal by delivering an output signal on said output terminal that transitions between logic levels, said second means controllably coupling the power supply terminal of said differential pair to the voltage supply until detecting the transition in the output signal which is delayed for providing the delayed feedback.

8. A method for controlling a differential pair input buffer, comprising:
   coupling the differential pair to a power supply through a first path during a transition between logic levels in a data input signal delivered to the differential pair;
   coupling the differential pair to the power supply through a second path for a period of time after the transition in the data input signal delivered to the differential pair, in which the second path allows for the differential pair to be coupled to the power supply for a delayed period of time, the delay being provided by a feedback from an output of the differential pair through a delay circuit coupled to said output terminal.

9. The method of claim 8, wherein the coupling the differential pair to the power supply through a second path includes maintaining the coupling of the differential pair to the power supply by delivering an output signal that has a delayed response to transitions between logic levels.

10. A buffer, comprising:
    a differential pair having a data input terminal, an output terminal, and first and second power supply terminals;
    a first transistor adapted for coupling said power supply terminal to a voltage supply, said first transistor having an enable input terminal coupled to said data input terminal;
    a second transistor coupled in parallel with said first transistor and having an enable input terminal coupled to receive a delayed output signal from the output terminal of said differential pair through a delay circuit coupled to said output terminal;

a third transistor adapted for coupling said second power supply terminal to a supply return, said third transistor having an enable input terminal coupled to said data input terminal; and a fourth transistor coupled in parallel with said third transistor and having an enable input terminal coupled to receive the delayed output signal from the output terminal of said differential pair.

11. The buffer of claim 10, wherein said first and second transistors are PMOS transistors and said third and fourth transistors are NMOS transistors.

12. The buffer of claim 10, further including a delay circuit coupled between the differential pair output terminal and the enable input terminals of the second and fourth transistors to provide the delay.

13. The buffer of claim 12, wherein said delay circuit includes at least one inverter.

* * * * *